Figure 1:
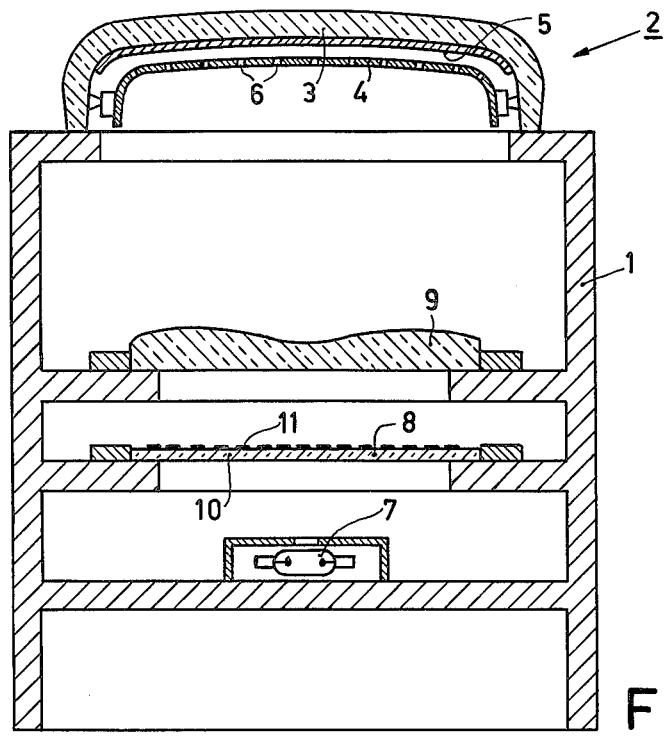

United States Patent [19]

van Heek

[11] 4,132,470
[45] Jan. 2, 1979

[54] EXPOSURE DEVICE FOR THE MANUFACTURE OF DISPLAY SCREENS OF COLOR TELEVISION DISPLAY TUBES AND DISPLAY TUBE MANUFACTURED BY MEANS OF SUCH A DEVICE

[75] Inventor: Herman F. van Heek, Eindhoven, Netherlands

[73] Assignee: U.S. Philips Corporation, New York, N.Y.

[21] Appl. No.: 776,256

[22] Filed: Mar. 10, 1977

[30] Foreign Application Priority Data

Mar. 17, 1976 [NL] Netherlands .................... 7602752

[51] Int. Cl.² .............................................. G03B 41/00
[52] U.S. Cl. .......................................... 354/1; 96/36.1; 313/408; 355/71
[58] Field of Search ...................... 354/1, 354; 355/71; 96/36.1, 27 E; 313/403, 408, 470

[56] References Cited

U.S. PATENT DOCUMENTS

| | | | |
|---|---|---|---|
| 3,312,143 | 4/1967 | Karow et al. | 355/71 X |
| 3,797,934 | 3/1974 | Miller et al. | 355/71 X |
| 3,856,525 | 12/1974 | Inoue | 354/1 X |
| 3,988,777 | 10/1976 | Hosokoshi et al. | 354/1 X |

*Primary Examiner*—Richard A. Wintercorn
*Attorney, Agent, or Firm*—David R. Treacy; Algy Tamoshunas

[57] ABSTRACT

An exposure device for the manufacture of display screens of color television display tubes is disclosed comprising a filter of non-uniform transmittance which includes a transparent plate provided with a large number of parallel opaque linear regions. The transmission of the filter is varied by varying the width of the linear regions.

3 Claims, 2 Drawing Figures

U.S. Patent  Jan. 2, 1979  4,132,470

EXPOSURE DEVICE FOR THE MANUFACTURE OF DISPLAY SCREENS OF COLOR TELEVISION DISPLAY TUBES AND DISPLAY TUBE MANUFACTURED BY MEANS OF SUCH A DEVICE

The invention relates to an exposure device for the manufacture of display screens of colour television display tubes, comprising a light source for exposing a photosensitive layer on a support for the display screen and a filter for correcting the light distribution on the support. The filter has a uniform transmittance and consists of a transparent plate which is provided with a large number of discrete opaque regions.

The display screen of a colour television display tube can be manufactured by providing a layer of a photosensitive phosphor suspension on the inside of a glass face plate portion and exposing the layer through a mask according to a given pattern. After the exposed layer is then developed to form a pattern of phosphor regions on the screen. This method is then repeated at least once to provide a pattern of phosphor regions which luminesce in a different colour. This and similar methods are carried out by an exposure device which comprises a suitable light source and which accommodates the face plate portion with the photosensitive layer. Such an exposure device also usually included a correction lens to correct the virtual position of the light source with respect to the face plate portion, as well as a filter to correct the light intensity distribution on the face plate portion. Without the use of a filter, the light intensity distribution on the face plate portion will not be such that in any place the phosphor regions have the correct dimensions and adhere sufficiently to the support. In general the light intensity distribution should be uniform, although certain deviations from uniformity are necessary in order to be able to vary the dimensions of the phosphor regions dependent on the place on the display screen. The transmission characteristic of the filter therefore depends on the requirements which are imposed upon the display screen, on the properties of the light source and on the correction lens being used. In general, the transmission characteristic of the filter will be comparatively non-uniform.

An exposure device of the kind mentioned in the first paragraph is known from German Offenlegungsschrift No. 24.40.575. This discloses a filter which consists of a transparent plate having a large number of opaque regions of comparatively small dimensions. The opaque regions are, for example, punctiform. The transmission of the filter is varied by varying the number of opaque regions per surface unit or their dimensions.

Other known and heretofore generally used filters consist of a transparent plate having a vapour-deposited metal layer of varying thickness and hence varying light transmission. The manufacture of such filters with the required accuracy, however, presents quite a few difficulties.

It is the object of the invention to provide an exposure device for the manufacture of colour television display tubes having a filter with uniform transmittance which can be manufactured very accurately in a simple manner.

According to the invention, in an exposure device of the kind described in the first paragraph the discrete opaque regions of the filter are formed by a large number of substantially parallel linear regions of varying width.

Such a filter is simple to manufacture because the desired variation in its light transmission along an arbitrary line is known. The variation of the transmission along a large number of parallel lines then determines directly the width of the linear opaque regions of the filter according to the invention. Of course, the pitch between the linear regions should also be considered.

Particularly good results are obtained when the light source is elongate and the smallest angle between the longitudinal direction of the light source and the longitudinal direction of the opaque regions is at least 30° and preferably substantially 90°.

Figure 2:
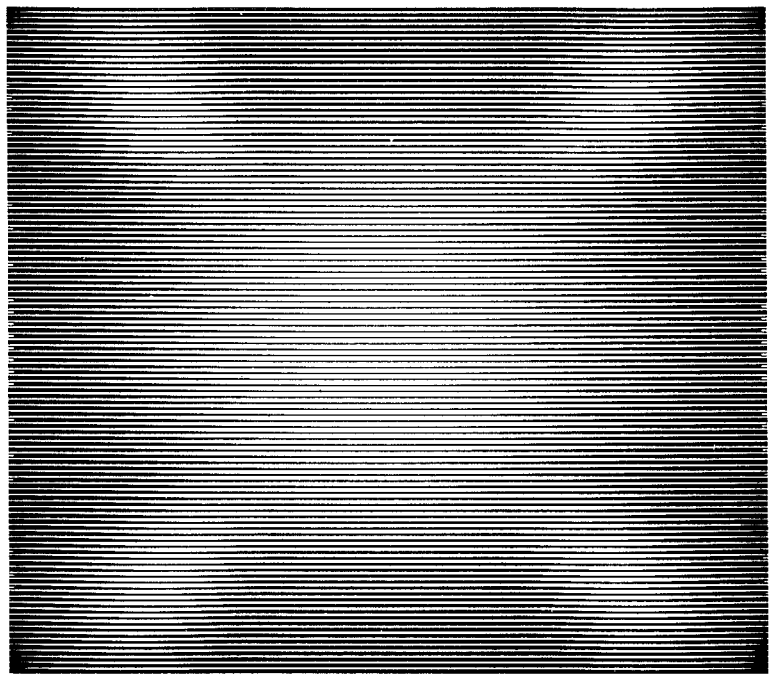

The invention will be described in greater detail with reference to the accompanying drawing, in which FIG. 1 shows an exposure device according to the invention, and FIG. 2 gives an example of a filter according to the invention.

The exposure device shown in FIG. 1 comprises a housing 1 supports a combination 2 of a face plate portion 3 and a shadow mask 4 for a colour television display tube The face plate portion 3 has a layer 5 of photosensitive phosphor suspension. The layer 5 is exposed through the apertures 6 in the shadow mask 4 to form phosphor regions corresponding to the apertures 6. This and similar methods are known per se from the prior art and need not be further explained.

The exposure device also includes a light source 7, a filter 8 and a correction lens 9. The filter 8 produces the desired light intensity distribution on the layer 5 and the correction lens 9, as is known, serves to adapt the virtual position of the light source 7 to the deflection point of the electron beams in the operating colour television display tube.

In the exposure device of the invention, the filter 8 is of a novel design. It includes of a transparent glass plate 10 provided with a large number of discrete opaque regions 11. The regions 11, which are shown diagrammatically in FIG. 1, are linear. The longitudinal direction of the regions 11 is perpendicular to the plane of the drawing of FIG. 1. The longitudinal direction of the light source 7 is parallel to the plane of the drawing of FIG. 1. That is, longitudinal the direction of the regions 11 is perpendicular to the longitudinal direction of the light source 7 This arrangement is a preferred embodiment of the invention; the light source could, for example, also be punctiform.

FIG. 2 shows, substantially at actual scale the negative which is used in the manufacture of the filter 8. The required variation of the light transmission of the filter is dependent entirely on the design of the colour television display tube and may differ for each individual case. The variation of the light transmission of the filter chosen as an example appears from inspection of FIG. 2. The distance between the lines 11 is 1 mm. The line width varies from 0.01 mm to 0.90 mm so that the light transmission varies from substantially 100% to 10%. The distance between the filter 8 and the light source 7 is 60 mm. The effectively used length of the light source 7 is 24 mm. As a result of the line structure of the filter 8, a small modulation of light intensity distribution on the layer 5 is obtained. This modulation has a wavelength of approximately 5 mm. Since the difference between the largest and the smallest light intensity as a result of the modulation is only 3% of the average light intensity at a given place, no disadvantage is experienced from said modulation. The data given above are applicable to the manufacture of display tubes having a picture diagonal of 66 cm. If for other tubes the modulation would be disadvantageous, it can simply be halved by halving the distance between the lines 11.

A filter according to the invention can be manufactured in an extremely simple manner by means of an optical drawing machine. In such a drawing machine, sired lines on a photosensitive negative for the filter. The local width of each line follows directly from the pitch between the lines times the desired local light transmission. A contact print is then made from the negative on a glass plate.

What is claimed is:

1. In an apparatus for exposing a photosensitive layer on a face plate of a colour television tube, said apparatus having a housing for supporting the face plate and an apertured shadow mask in a predetermined relationship, a light source positioned in the housing for exposing the photosensitive layer to light passing through the apertures in the shadow mask and a filter positioned between the mask and the light source for correcting the intensity distribution of the light incident on the photosensitive layer, the improvement wherein said filter has regions of different light transmittance and includes a transparent plate provided with a multiplicity of opaque, substantially parallel, spaced lines, said regions of different transmittance being formed by variations in the width of said lines.

2. The apparatus according to claim 1 wherein said light source is elongated and oriented with respect to said filter so that the longitudinal direction of said light source is skewed at least 30° from the longitudinal direction of said opaque lines.

3. The apparatus according to claim 2 wherein the longitudinal direction of said light source is substantially perpendicular to said opaque lines.

* * * * *